US012784850B2

(12) United States Patent
Jaiswal et al.

(10) Patent No.: US 12,784,850 B2
(45) Date of Patent: Nov. 3, 2026

(54) METHOD AND SYSTEM FOR ENHANCING LIFESPAN OF A NAND FLASH MEMORY

(71) Applicant: Samsung Electronics Co., Ltd., Suwon-si (KR)

(72) Inventors: Akhilesh Kumar Jaiswal, Bengaluru (IN); Sumeet Paul, Bengaluru (IN); Puneet Kukreja, Bengaluru (IN); Shankar Athanikar, Bengaluru (IN); Vinay Kumar M N, Bengaluru (IN)

(73) Assignee: Samsung Electronics Co., Ltd., Suwon-si (KR)

( * ) Notice: Subject to any disclaimer, the term of this patent is extended or adjusted under 35 U.S.C. 154(b) by 39 days.

(21) Appl. No.: 18/971,427

(22) Filed: Dec. 6, 2024

(65) Prior Publication Data

US 2026/0112426 A1 Apr. 23, 2026

(30) Foreign Application Priority Data

Oct. 18, 2024 (IN) ............................ 202441079467

(51) Int. Cl.
*G11C 16/34* (2006.01)

(52) U.S. Cl.
CPC ...... *G11C 16/3459* (2013.01); *G11C 16/3404* (2013.01); *G11C 16/3422* (2013.01)

(58) Field of Classification Search
CPC ............ G11C 16/3459; G11C 16/3404; G11C 16/3422; G11C 16/0483; G11C 16/16; G11C 16/3495; G11C 16/349; G06F 3/0616; G06F 3/0644; G06F 3/0679; G06F 11/0727; G06F 11/079
USPC .................................................... 356/185.09
See application file for complete search history.

(56) References Cited

U.S. PATENT DOCUMENTS

2015/0067244 A1* 3/2015 Kruger ................ G06F 11/1451
711/103
2019/0155703 A1 5/2019 Dubeyko et al.
2021/0210157 A1 7/2021 Puthoor et al.

FOREIGN PATENT DOCUMENTS

CN 104464821 A 3/2015
KR 20200100167 A * 8/2020 .......... G06F 11/1044

OTHER PUBLICATIONS

WO 2015034954 A1, all pages, (Year: 2015).*

* cited by examiner

*Primary Examiner* — Fernando Hidalgo
(74) *Attorney, Agent, or Firm* — Wolf, Greenfield & Sacks, P.C.

(57) ABSTRACT

A method of operating a NAND flash memory of a host device includes detecting a temporary failure of a first NAND block among a plurality of NAND blocks, in response to detecting the temporary failure of the first NAND block, determining a failure verification parameter of the first NAND block, assigning the first NAND block to a temporary bad block (TBB) list based on the failure verification parameter and a number of a set of the plurality of NAND blocks assigned to the TBB list, and determining that the NAND flash memory has failed when the number of the set of NAND blocks assigned to the TBB list is greater than or equal to a threshold NAND block number.

20 Claims, 8 Drawing Sheets

METHOD AND SYSTEM FOR ENHANCING LIFESPAN OF A NAND FLASH MEMORY

CROSS-REFERENCE TO RELATED APPLICATION

This present application claims priority to and the benefit under 35 U.S.C. § 119(a)-(d) of Indian Patent Application No. 202441079467, filed Oct. 18, 2024, in the Indian Patent Office, the entire disclosure of which is incorporated herein by reference.

TECHNICAL FIELD

The present subject matter is generally related to a NAND flash memory device, and more particularly, but not exclusively, to a method and system for enhancing a lifespan of a NAND flash memory having a plurality of NAND blocks performing read/write operations.

BACKGROUND

Generally, flash memory is an electronic non-volatile computer memory storage medium that can be electrically erased and reprogrammed. There are various types of flash memory, such as NOR flash and NAND flash memories. The NOR flash and the NAND flash memories may differ at the circuit level depending on whether the state of the bit line or word lines is pulled high or low. Particularly, in NAND flash, the relationship between the bit line and the word lines resembles or corresponds to a NAND gate. The NAND type may be used in memory cards, USB flash drives, embedded multimedia card (eMMC), universal flash drive (UFS), solid-state drives in smartphones, and the like, for general storage and transferring of data.

However, the NAND flash may fail due to various reasons. The errors in NAND flash may be classified into two major categories: permanent (non-correctable) errors and temporary (correctable) errors. The temporary errors in NAND Flash may include, but are not limited to, program disturb, read disturb, over-programming and retention errors.

The information disclosed in this background of the disclosure section is only for enhancement of understanding of the general background of the present disclosure and should not be taken as an acknowledgement or any form of suggestion that this information forms the prior art already known to a person skilled in the art.

SUMMARY

Disclosed herein is a method of enhancing or operating the lifespan of a NAND flash memory having a plurality of NAND blocks performing read/write operations. The method comprises detecting a failure of a first NAND block among a plurality of NAND blocks, in response to detecting the failure of the first NAND block, determining a failure verification parameter of the first NAND block, where the failure verification parameter includes at least one of a junction temperature of the first NAND block, one or more voltage levels of the first NAND block, or an ON/OFF cell count of the first NAND block, assigning the first NAND block to a temporary bad block (TBB) list based on the failure verification parameter and a number of a set of the plurality of NAND blocks assigned to the TBB list, and determining that the NAND flash memory has failed in response to the number of the set of NAND blocks assigned to the TBB list being greater than or equal to a threshold NAND block number.

Further, the present disclosure relates to a computing system for enhancing or operating the lifespan of a NAND flash memory having a plurality of NAND blocks performing read/write operations. The computing system comprises a processor and a memory, communicatively coupled to the processor. The memory stores processor-executable instructions, which on execution cause the processor to detect a failure of a first NAND block among the plurality of NAND blocks, in response to detecting the failure of the first NAND block, determine a failure verification parameter of the first NAND block, where the failure verification parameter includes at least one of a junction temperature of the first NAND block, one or more voltage levels of the first NAND block, and an ON/OFF cell count of the first NAND block, assign the first NAND block to a temporary bad block (TBB) list based on the failure verification parameter and a number of a set of the plurality of NAND blocks assigned to the TBB list, determine that the NAND flash memory has failed in response to the number of the set of NAND blocks assigned to the TBB list being greater than or equal to a threshold NAND block number.

The present disclosure provides a method of operating a NAND flash memory of a host device, the NAND flash memory having a plurality of NAND blocks configured to perform a read/write operation includes: determining whether a number of read/write operation failures is greater than a threshold failure number, detecting a failure of a first NAND block among a plurality of NAND blocks in response to a determination that the number of read/write operation failures is greater than the threshold failure number, where the failure is one of a program failure, an erase failure, or an uncorrectable error correction code, in response to detecting the failure of the first NAND block, determining a failure verification parameter of the first NAND block, where the failure verification parameter includes at least one of a junction temperature of the first NAND block, one or more voltage levels of the first NAND block, or an ON/OFF cell count of the first NAND block, determining whether the failure verification parameter corresponds to a temporary failure condition, determining whether a number of a set of the plurality of NAND blocks assigned to a temporary bad block (TBB) list is less than a threshold NAND block number, and assigning the first NAND block to the TBB list in response to a determination that the failure verification parameter corresponds to the temporary failure condition and in response to a determination that the number of the set of the plurality of NAND blocks assigned to the TBB list is less than the threshold NAND block number.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The accompanying drawings, which are incorporated in and constitute a part of this disclosure, illustrate exemplary embodiments and, together with the description, explain the disclosed principles. In the figures, the left-most digit(s) of a reference number identifies the figure in which the reference number first appears. The same numbers are used throughout the figures to reference features and components. Some embodiments of the system and/or methods in accordance with embodiments of the present subject matter are now described, by way of example only, and regarding the accompanying figures, in which.

Figure 1:
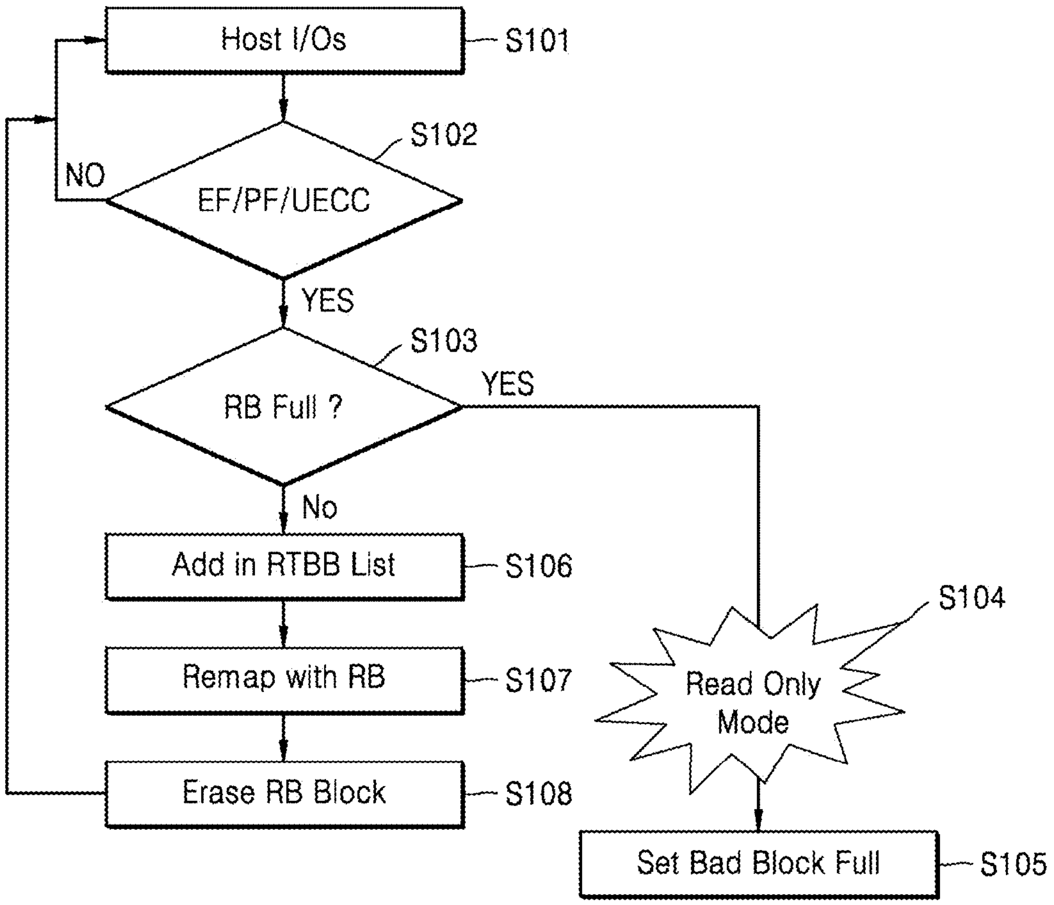
FIG. 1 (RELATED ART)
FIG. 1 illustrates a flowchart of NAND flash memory with the temporary failure in accordance with the prior art.

It should be appreciated by those skilled in the art that any block diagrams herein represent conceptual views of illustrative systems embodying the principles of the present subject matter. Similarly, it will be appreciated that any flow charts, flow diagrams, state transition diagrams, pseudo code, and the like represent various processes which may be substantially represented in computer readable medium and executed by a computer or processor, whether such computer or processor is explicitly shown.

DETAILED DESCRIPTION

In a NAND flash memory system, environmental factors like temperature may affect both the performance and reliability. When the NAND flash memory operates at high temperatures, operations such as programming, erasing and reading may be difficult for NAND cells. Most of the NAND flash memory works normally within defined temperature ranges, such as 0~70° C., but it varies among different products, such as solid-state drive (SSD), universal flash storage (UFS), or an embedded multimedia card (eMMC). If the device operates beyond operating temperature range, there may be a possibility of program failure, erase failure and uncorrectable error (UECC) (Blocks S101 and S102 of FIG. 1). Once failure occurs on any block, as per bad block (BB) management policy, the NAND block may be replaced with a reserved block (RB) (Blocks S103, S106, S107, and S108 of FIG. 1). Since the device still operates at relatively higher temperature, there may be a chance of erase failure on reserved blocks, and if this process repeats continuously, then all the RBs will be exhausted, which causes the host device to enter a read only mode (Blocks S104 and S105 in FIG. 1). In some aspects, a mechanism may be provided to enhance lifespan of a NAND flash memory device and prevent or inhibit NAND flash memory devices entering the read only mode. Also, in some aspects, a method and system may address one or more drawbacks of the existing systems.

In the present document, the word "exemplary" is used herein to mean "serving as an example, instance, or illustration." Any embodiment or implementation of the present subject matter described herein as "exemplary" is not necessarily to be construed as preferred or advantageous over other embodiments.

While the disclosure is susceptible to various modifications and alternative forms, specific embodiment thereof has been shown by way of example in the drawings and will be described in detail below. It should be understood, however that it is not intended to limit the disclosure to the specific forms disclosed, but on the contrary, the disclosure is to cover all modifications, equivalents, and alternative falling within the spirit and the scope of the disclosure.

The terms "comprises," "comprising," "includes," or any other variations thereof, are intended to cover a non-exclusive inclusion, such that a setup, device, or method that comprises a list of components or steps does not include only those components or steps but may include other components or steps not expressly listed or inherent to such setup or device or method.

In other words, one or more elements in a system or apparatus proceeded by "comprises . . . a" does not, without more constraints, preclude the existence of other elements or additional elements in the system or method.

Embodiments of the present disclosure relate to a method for enhancing a lifespan of a NAND flash memory having a plurality of NAND blocks performing read/write operations. The NAND flash memory is a type of non-volatile storage technology that may not require power to retain data. One objective of NAND flash memory device is to reduce the cost per bit and to increase maximum chip capacity so that flash memory can compete with magnetic storage devices, such as hard disks. In NAND flash, the relationship between the bit line and the word lines resembles or corresponds to a NAND gate. The NAND type may be used in memory cards, USB flash drives, solid-state drives in smartphones, and the like, for general storage and transferring of data.

When the NAND flash device operates outside of an operating temperature range and an operating voltage range, there is a possibility of an erase failure, program failure or UECC during read operations, and if devices keep operating at same environment, each reserved block (RB) of the host device may be exhausted, and it will become or enter the readonly mode as shown in FIG. 1. In such instances, the present disclosure may provide a method including detecting failure within one or more NAND blocks among the plurality of NAND blocks and determining whether the failure is temporary or permanent in nature. Detection of temporary failures may be detected using a three-stage verification process based on the junction temperature of the NAND block (e.g., a temperature of a transistor junction of the NAND block), voltage levels (e.g., a supply voltage for an input/output interface of the NAND flash device (VCCQ) and/or a supply voltage for operating the memory cells of the NAND blocks (VCC)), and an ON/OFF cell count (e.g., the number of times the NAND block is switched between a program state (ON) and an erase state (OFF)). Further, the method includes transferring the NAND block with the temporary failure to the temporary bad block (TBB) list. The above-mentioned steps of detecting the temporary failure and transferring NAND blocks to TBB are performed if the temporary failure continues for the plurality of NAND blocks until the TBB list is full (e.g., a number of a set of the plurality of NAND blocks assigned to the TBB list is less than a threshold NAND block number). Thus, preventing reserved blocks (RB) from being utilized prevents or inhibits the device entering into the read only mode. Furthermore, the method may include setting an exception bit such that a host device having the NAND flash memory is reset when the TBB list is full (e.g., a number of a set of the plurality of NAND blocks assigned to the TBB list is greater than or equal to a threshold NAND block number). In other words, the utilization of RB blocks may be quick, and the host device may enter the read only mode if the host device continues to operate in an abnormal environment.

Thus, the present disclosure may be used for enhancing the lifespan of or operating a NAND flash memory having a plurality of NAND blocks performing read/write operations. As the present disclosure initially detects the temporary EF, PF and UECC errors, which may avoid unnecessary RB remapping. The use case scenario of the present disclosure may be in automotive UFS or SSDs but is not limited thereto. In the above-mentioned case scenario, the NAND flash memory device may be used in various geographical scenarios and may be operated at different high or low temperatures that may cause a temporary failure. During such scenarios, the present disclosure causes the host device to reset the device when the device (NAND flash memory) is operating in an abnormal host environment.

In the following detailed description of the embodiments of the disclosure, reference is made to the accompanying drawings that form a part hereof, and in which are shown by way of illustration specific embodiments in which the disclosure may be practiced. These embodiments are described in sufficient detail to enable those skilled in art to practice the disclosure, and it is to be understood that other embodiments may be utilized and that changes may be made without departing from the scope of the present disclosure. The following description is, therefore, not to be taken in a limiting sense.

Figure 2:
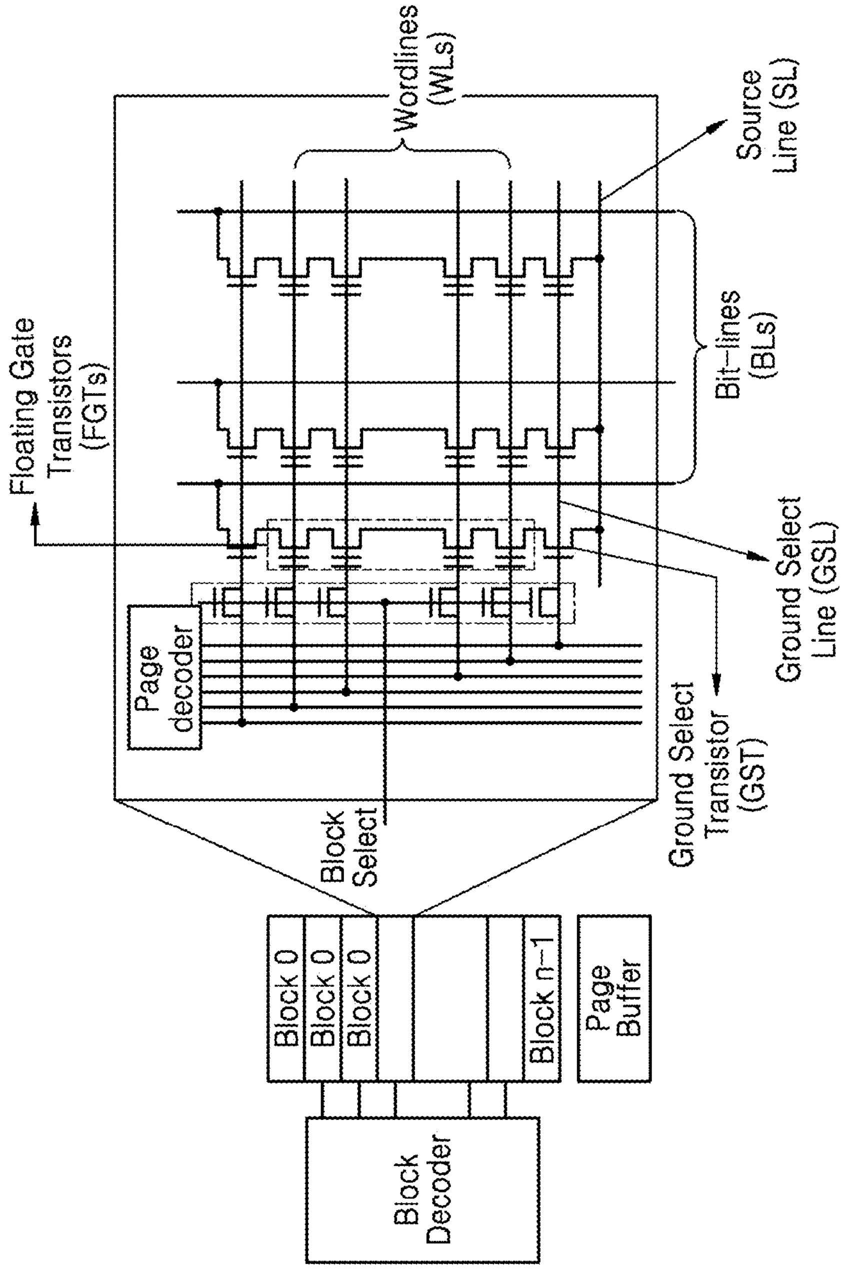
FIG. 2 illustrates an exemplary architecture of a NAND flash memory having a plurality of NAND blocks performing read/write operations in accordance with some embodiments of the present disclosure.

FIG. 2 illustrates an exemplary diagram of NAND flash memory configured in the apparatus for enhancing a lifespan of a NAND flash memory having a plurality of NAND blocks performing read/write operations in accordance with some embodiments of the present disclosure. In some embodiments, the NAND flash memory apparatus may include a block decoder, NAND blocks 0, 1, 2, . . . n−1, a ground select transistor GST, a ground select line GSL, a source line SL, bit lines BLs, floating gate transistors FGTs, word lines WLs, and a page decoder.

The hierarchical structure of NAND flash starts at a cell level which establishes strings, pages, blocks, planes and a die. A string is a series of connected NAND cells in which the source of one cell is connected to the drain of the next one. In other words, NAND flash memory cells are organized in an array, block, and page hierarchy, as shown in FIG. 2. The NAND flash memory array may be partitioned into a plurality of NAND blocks, and each block contains a number of pages. Further, each NAND block may include 16-64 memory cells as shown in the FIG. 2. All the memory cells within the same block may be erased at the same time and data may be programmed and fetched in the unit of page. All the memory cell blocks may share the bit-lines and an on-chip page buffer that holds the data being programmed. However, the NAND flash memory may behave abnormally if the host environment is not within the range of 0-70° C. Accordingly, it may be desirable to detect a temporary failure within a NAND block. The temporary failure within a NAND block may be identified using a three-stage verification process via a processor of the apparatus. The three-stage verification process is performed based on a junction temperature of the NAND block, one or more voltage levels (e.g., VCC/VCCQ), and the ON/OFF cell count. The temporary failure may be one of a program failure (PF), erase failure (EF), or uncorrectable error correction code (UECC). Based on the detection of the temporary failure within NAND blocks, the processor may assign the NAND blocks with the temporary failure to a temporary bad block (TBB) list. Further, if the temporary failure continues, the detection of the temporary failure and assignment of the NAND blocks may be performed repeatedly until the TBB list is full (e.g., a number of a set of the plurality of NAND blocks assigned to the TBB list is greater than or equal to a threshold NAND block number). Further, the processor may set an exception bit such that a host device having the NAND flash memory is reset when the TBB list is full.

Figure 3:
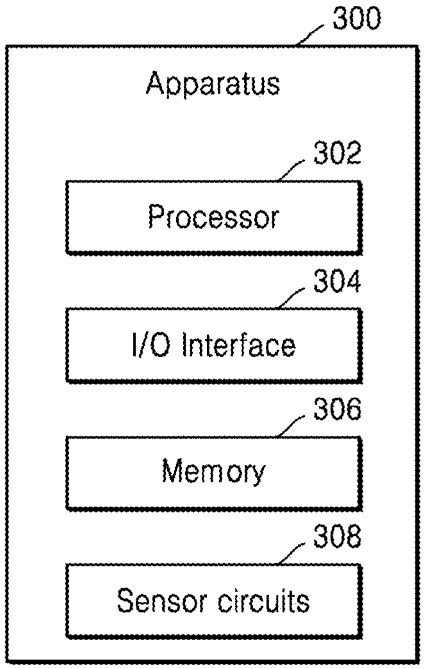
FIG. 3 shows a detailed block diagram illustrating the apparatus for enhancing a lifespan of a NAND flash memory having a plurality of NAND blocks performing read/write operations in accordance with some embodiments of the present disclosure.

FIG. 3 shows a detailed block diagram illustrating the apparatus for enhancing a lifespan of a NAND flash memory having a plurality of NAND blocks performing read/write operations, in accordance with some embodiments of the present disclosure.

FIG. 3 illustrates the apparatus that may comprise various hardware components such as a processor 302, an I/O interface 304, a memory 306, and sensor circuits 308, but is not limited thereto. The processor 302, the memory 306, the I/O interface 304, and the sensor circuits 308 may be communicatively coupled to each other via wired or wireless communication channels. Further, the processor 302 may be configured to execute instructions stored in the memory 306 and to perform various processes, such as determining the junction temperature and/or voltage levels of the NAND blocks based on electrical and/or thermal data output by the sensor circuits 308 (e.g., a temperature sensor, a voltage/current sensor, a resistance sensor that correlates resistance measurements to temperature, etc.). The I/O interface 304 may be configured for coupling the internal hardware components and with external devices via one or more networks. The memory may also store instructions to be executed by the processor. The memory may include a random-access memory (RAM) unit and/or a non-volatile memory unit such as a read only memory (ROM), optical disc drive, magnetic disc drive, flash memory, electrically erasable read only memory (EEPROM), a memory space on a server or cloud and so forth. The memory 306 may also store data processed by the processor and obtained via I/O interface 304.

In some embodiments, the processor 302 may be configured to detect a temporary failure within a NAND block, among the plurality of NAND blocks, using a three-stage verification process. Initially, the processor 302 may receive a read/write request from the host device. Further, the processor 302 may perform a read/write operation in response to receiving the read/write request. The processor 302 may detect a temporary failure within NAND blocks, among the plurality of NAND blocks. The temporary failure may be one of a program failure (PF), erase failure (EF), or uncorrectable error correction code (UECC). The processor 302 may then detect whether the failure consequently occurred more than a threshold failure number (e.g., three times) upon performing the read/write operations. When the failure of the NAND blocks consequently occurred more than the threshold failure number, the three-stage verification process is performed based on the junction temperature, voltage levels (e.g., VCC/VCCQ), and ON/OFF cell count. However, if the three-stage verification process determines that the junction temperature, voltage levels (VCC/VCCQ), and ON/OFF cell count are within the predefined range, then the processor 302 may categorize the failure as a permanent failure of NAND flash memory, as described below in further detail.

If any one of the junction temperature, voltage levels (VCC/VCCQ), and ON/OFF cell count is operating outside of the respective threshold range, then the processor 302 determines the failure is a temporary failure, and the processor 302 may list the NAND blocks with the temporary failure being detected to a temporary bad block (TBB) list. For instance, when the junction temperature is outside of the threshold junction temperature range (0-70° C.), then the processor 302 may not check for the voltage levels (VCC/VCCQ) and the ON/OFF cell count. The processor 302 may assign the NAND block to the TBB upon determining that the TBB is not full (e.g., a number of a set of the plurality of NAND blocks assigned to the TBB list is less than a threshold NAND block number). Further, when the host device operates during a normal condition (i.e., when the junction temperature is within 0-70° C. and the voltage levels VCC/VCCQ are within respective voltage threshold ranges), then the processor 302 may perform an erase operation on NAND blocks listed in the TBB list during standard operating conditions, as described below in further detail.

In another example, when the junction temperature is within the threshold junction temperature range, then the processor 302 may determine whether the voltage levels (VCC/VCCQ) are outside of a threshold operating voltage range. In other words, when the temperature of the host environment is within the operating range, the processor 302 may check the operating voltage levels. If the voltage levels are not within the threshold operating voltage range, then the processor 302 may determine whether the TBB is full (e.g., whether a number of a set of the plurality of NAND blocks assigned to the TBB list is greater than or equal to a threshold NAND block number). When the processor 302 determines that TBB is not full, then the processor 302 may assign the NAND block to the TBB and perform an erase operation on NAND blocks listed in the TBB list during standard operating conditions, as described below in further detail.

As another example, when both the junction temperature and the voltage levels are within the respective threshold ranges, then the processor 302 may compare the ON/OFF cell count to a threshold count value. When the ON/OFF cell count exceeds the threshold count value, then the processor 302 may assign the NAND block to the TBB list. Further, if the processor 302 determines that the ON/OFF cell count is less than or equal to the threshold count value, then the processor 302 may inform host that the failure of the NAND flash memory is not temporary in nature and the failure may be considered as a permanent failure.

Figure 4:
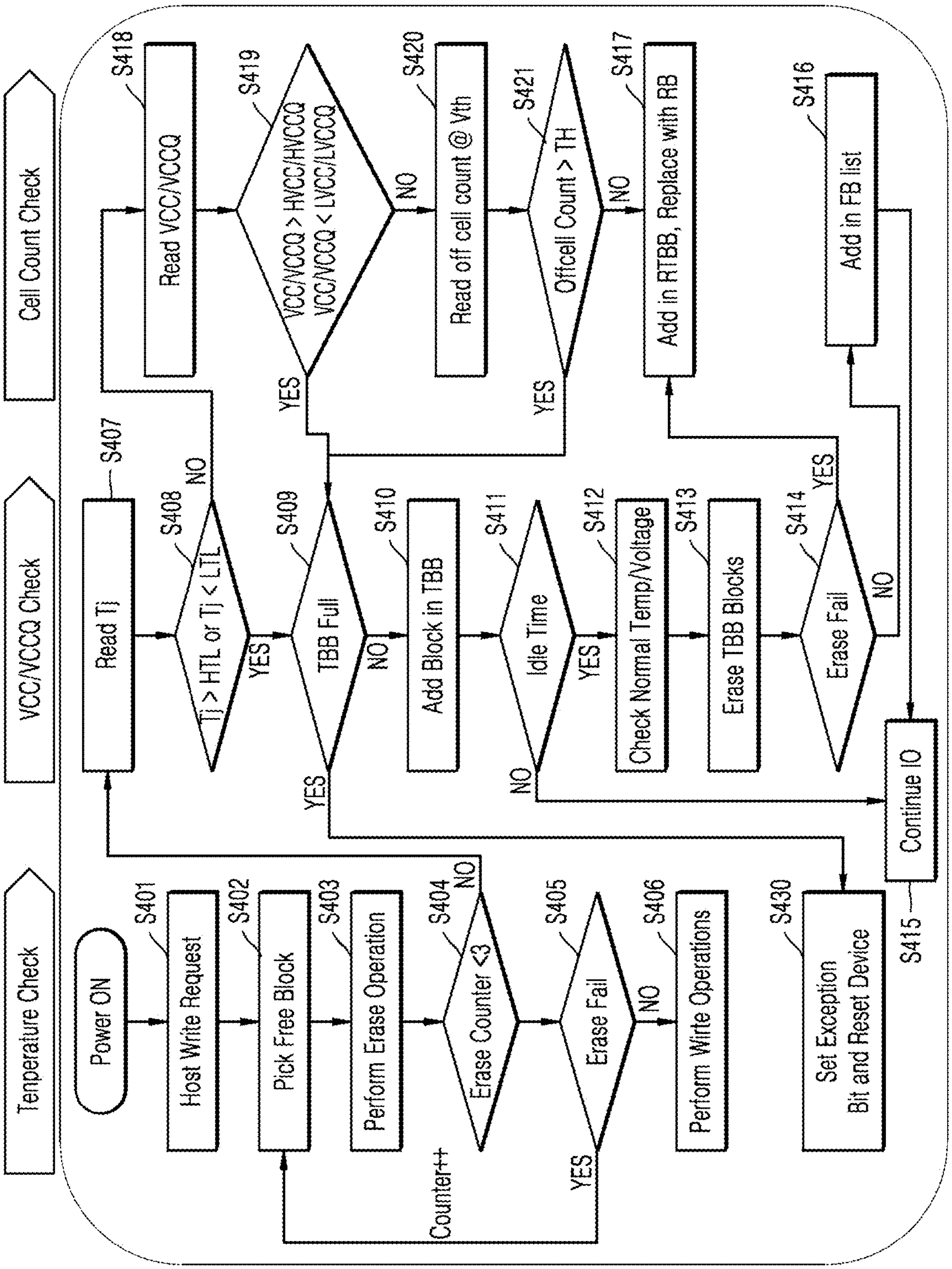
FIG. 4 shows a flowchart illustrating a method of detecting the temporary failure using the three-stage verification process when the temporary failure is an erase failure in accordance with some embodiments of the present disclosure.

FIG. 4 shows a flow chart illustrating a method for detecting the temporary failure using the three-stage verification in accordance with some embodiments of the present disclosure.

The three-stage verification process is performed independently on junction temperature, voltage levels (VCC/VCCQ), and ON/OFF cell count. As an example, the processor 302 may receive a write request from the host device and select a free NAND block (S401 and S402). Based on the received write request, the processor 302 may perform erase operation before write operation (S403, S404, S405, and S406). Further, the processor 302 may detect a presence of failure and determine whether the number of write operation failures is greater than a threshold failure number (e.g., 3) (S405 and S406). If the number of write operation failures is greater than the threshold failure number, then the processor 302 may determine whether the junction temperature is outside of an operating temperature range (e.g., is the junction temperature greater than HTL or less than LTL, as shown by S407 and S408) based on temperature data obtained from the sensor circuits 308. If the junction temperature is outside of a threshold junction temperature range, then the processor 302 may assign the NAND block to the TBB upon determining that the TBB is not full (e.g., a number of a set of the plurality of NAND blocks assigned to the TBB list is less than a threshold NAND block number) (S409 and S410) and perform an erase operation on NAND blocks listed in the TBB list during standard operating conditions (S411, S412, S413, S414, S415, S416, S417, and S430, which are described below in further detail with reference to FIG. 7). When the junction temperature is within the operating temperature range, the processor 302 may determine whether the voltage levels are within the threshold voltage ranges (e.g., a determination of whether VCC and VCCQ are greater than respective upper voltage limits (HVCC and HVCCQ) or less than lower voltage limits (LVCC and LVCCQ)) (S418 and S419), and determine whether the TBB list is full in response to the voltage levels being outside of the threshold voltage ranges when the voltage levels (VCC/VCCQ) are outside of the threshold operating voltage ranges (S409). When the voltage levels are within the threshold operating voltage ranges, the processor 302 may compare the ON/OFF cell count to a threshold count value and assign the NAND block to the TBB list if the ON/OFF cell count is greater than the threshold count value (S420 and S421).

Figure 5:
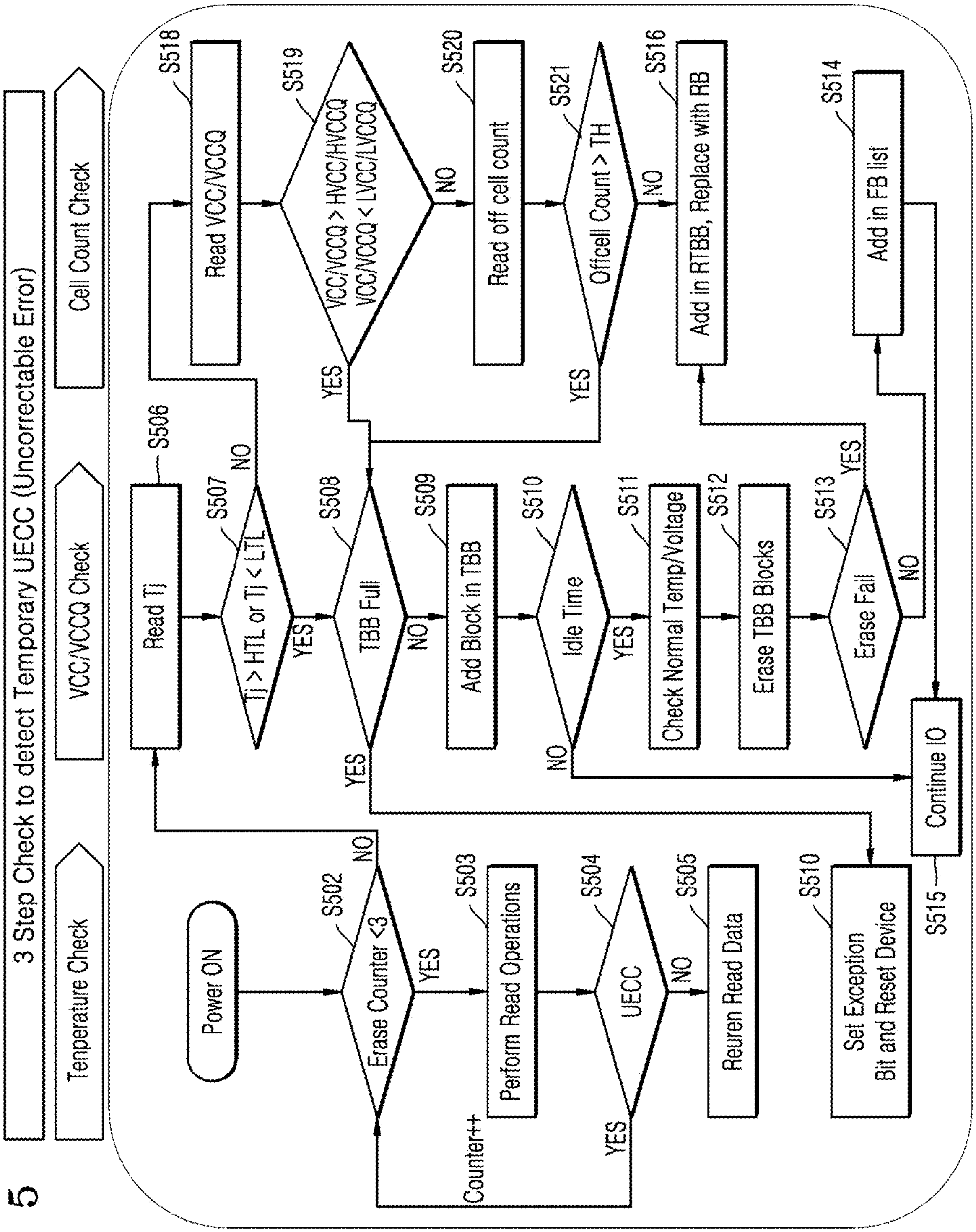
FIG. 5 shows a flowchart illustrating a method of detecting the temporary failure using the three-stage verification process when the temporary failure is an uncorrectable error (UECC) in accordance with some embodiments of the present disclosure.

As another example and with reference to FIG. 5, when the temporary failure is a UECC, then the processor 302 may initially receive a read request from the host device (S501). Based on the received read request, the processor may perform a read operation (S502, S503, S504, and S505). The processor 302 may perform the read request when the number of read operation failures is greater than a threshold failure number (e.g., 3) (S502, S503, and S504). In other words, when the temporary failure is the UECC (S504), the processor 302 may determine whether the junction temperature is outside of a threshold junction temperature range (e.g., a determination of whether the junction temperature is greater than HTL or less than LTL, as shown by S506 and S507) based on temperature data obtained from the sensor circuits 308. If the junction temperature is outside of the threshold junction temperature range, then the processor 302 may assign the NAND block to the TBB upon determining that the TBB is not full (e.g., a number of a set of the plurality of NAND blocks assigned to the TBB list is less than a threshold NAND block number) (S508 and S509) and perform the erase operation on NAND blocks listed in the TBB list during standard operating conditions (S510, S511, S512, S513, S514, S516, and S517, which are described below in further detail with reference to FIG. 7). When the junction temperature is within the threshold junction temperature range, the processor 302 may determine whether the voltage levels are within the threshold voltage ranges (e.g., a determination of whether VCC and VCCQ are greater than respective upper voltage limits (HVCC and HVCCQ) or less than lower voltage limits (LVCC and LVCCQ)) (S518 and S519), and determine whether the TBB list is full in response to the voltage levels being outside of the threshold voltage ranges when the voltage levels (VCC/VCCQ) are outside of the threshold operating voltage ranges (S508). When both the junction temperature and the voltage levels are within the respective threshold operating ranges, the processor 302 may compare the ON/OFF cell count to a threshold count value and assign the NAND block to the TBB list if the ON/OFF cell count is greater than the threshold count value (S520 and S521).

Figure 6:
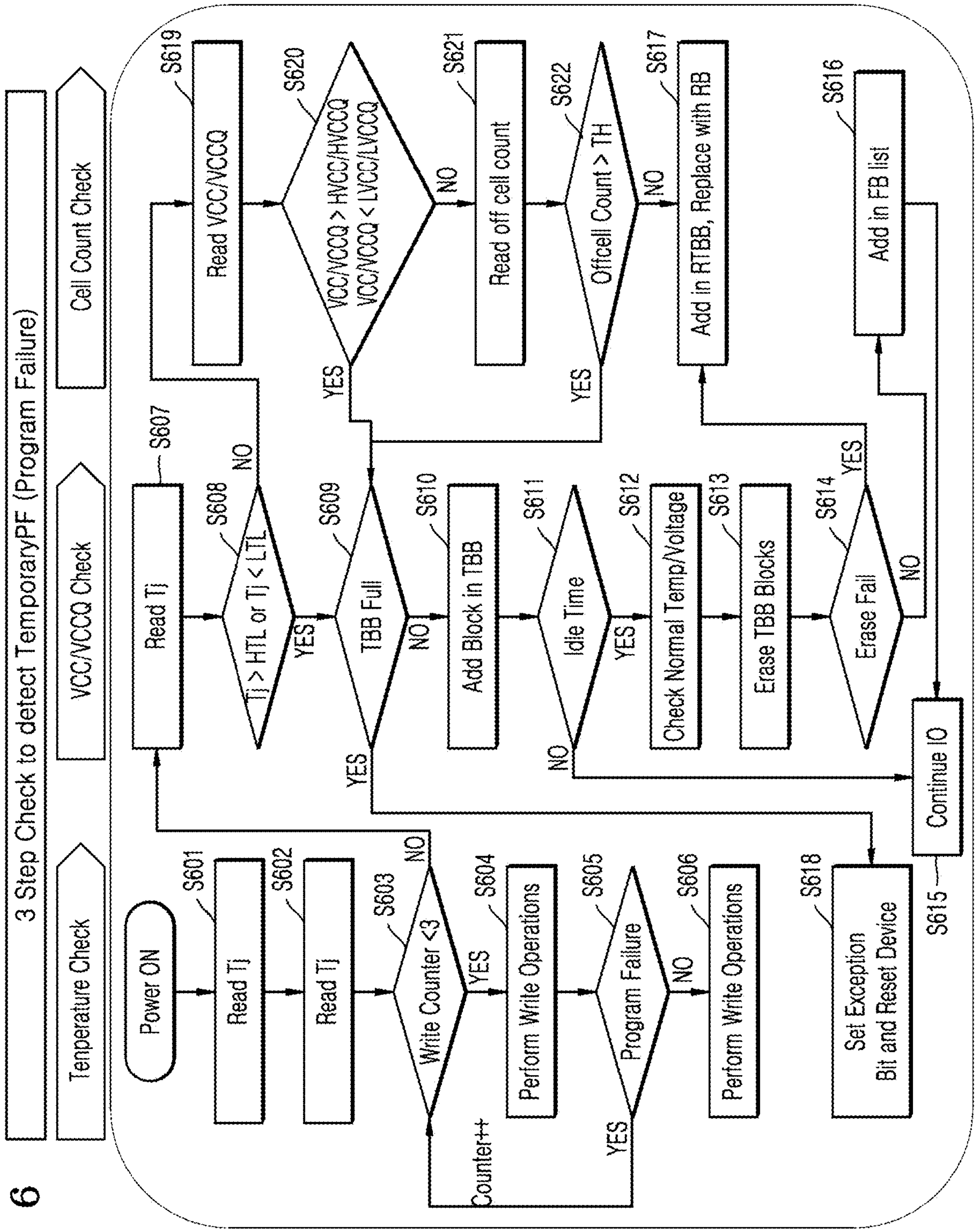
FIG. 6 shows a flowchart illustrating a method of detecting the temporary failure using the three-stage verification process when the temporary failure is a program failure in accordance with some embodiments of the present disclosure.

As another example and with reference to FIG. 6, when the temporary failure is a program failure, then the processor 302 may initially receive a write request from the host device (S601). Based on the received write request, the processor 302 may perform the write operation (S602, S603, S604, S605, and S606). The processor 302 may perform the write request when the number of write operation failures is less than a threshold failure number (e.g., 3) (S603, S604, S605, and S606). In other words, when the temporary failure is program failure (S605), the processor 302 may determine whether the junction temperature is outside of a threshold junction temperature range (e.g., a determination of whether the junction temperature is greater than HTL or less than LTL, as shown by S607 and S608) based on temperature data obtained from the sensor circuits 308. If the junction temperature is outside of the threshold junction temperature range, then the processor 302 may assign the NAND block to the TBB upon determining that the TBB is not full (e.g., a number of a set of the plurality of NAND blocks assigned to the TBB list is less than a threshold NAND block number) (S609 and S610) and perform an erase operation on NAND blocks listed in the TBB list during standard operating conditions (S611, S612, S613, S614, S615, S616, and S617, which are described below in further detail with reference to FIG. 7). If the TBB list is full, the processor 302 may set an exception bit and reset the device (S618), which is described below in further detail. When the junction temperature is within the threshold junction temperature range, the processor 302 may determine whether the voltage levels are within the threshold voltage ranges (e.g., a determination of whether VCC and VCCQ are greater than respective upper voltage limits (HVCC and HVCCQ) or less than lower voltage limits (LVCC and LVCCQ)) (S619 and S620), and determine whether the TBB list is full in response to the voltage levels being outside of the threshold voltage ranges when the voltage levels (VCC/VCCQ) are outside of the operating voltage ranges (S609). When both the junction temperature and the voltage levels are within the respective threshold operating ranges, the processor 302 may compare the ON/OFF cell count to a threshold count value and assign the NAND block to the TBB list if the ON/OFF cell count is greater than the threshold count value (S621, S622).

Figure 7:
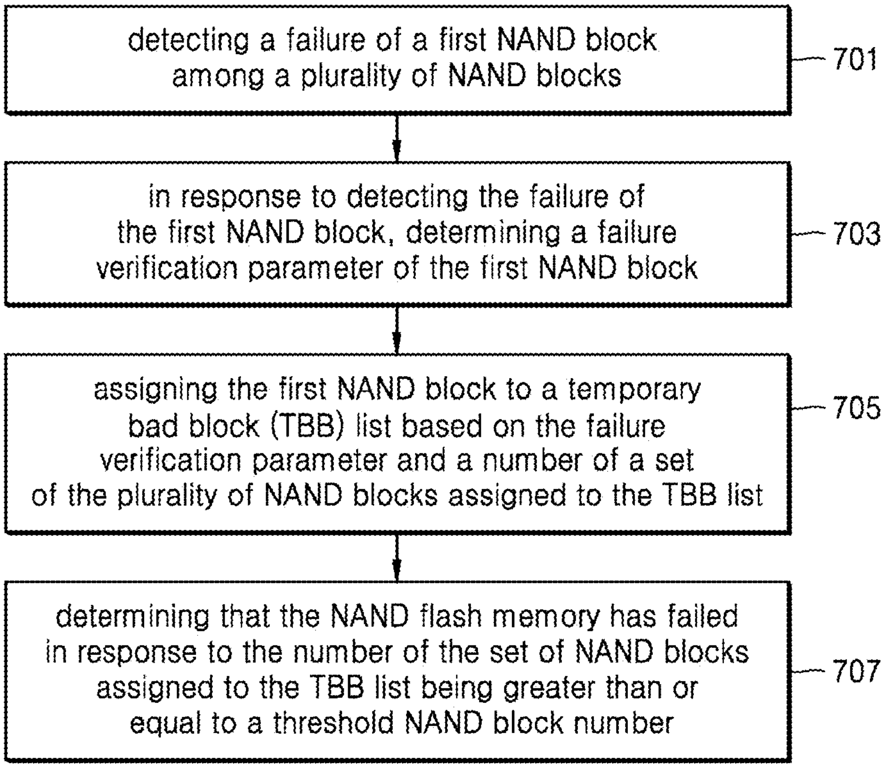
FIG. 7 shows a flowchart illustrating a method for enhancing a lifespan of a NAND flash memory having a plurality of NAND blocks performing read/write operations in accordance with some embodiments of the present disclosure.

FIG. 7 shows a flowchart illustrating a method for enhancing a lifespan of a NAND flash memory having a plurality of NAND blocks performing read/write operations, in accordance with some embodiments of the present disclosure.

As illustrated in FIG. 7, the method 700 includes one or more blocks illustrating a method of enhancing a lifespan of a NAND flash memory having a plurality of NAND blocks performing read/write operations. The method 700 may be described in the general context of computer executable instructions. Generally, computer executable instructions can include routines, programs, objects, components, data structures, procedures, modules, and functions, which perform functions or implement abstract data types.

The order in which the method 700 is described is not intended to be construed as a limitation, and any number of the described method blocks can be combined in any order to implement the method 700. Additionally, individual blocks may be deleted from the methods without departing from the spirit and scope of the subject matter described herein. Furthermore, the method 700 can be implemented with any suitable hardware, software, firmware, or combination thereof.

At block 701, the method 700 may include detecting, by a processor 302, a temporary failure within or of a first NAND blocks among the plurality of NAND blocks. The temporary failure may be one of program failure (PF), an erase failure (EF), or an uncorrectable error correction code (UECC). At block 703, the processor 302 determines, in response to detecting the temporary failure of the first NAND block, a failure verification parameter of the first NAND block, where the failure verification parameter comprises at least one of a junction temperature of the first NAND block, one or more voltage levels of the first NAND block (e.g., VCC/VCCQ), or an ON/OFF cell count of the first NAND block. To determine the failure verification parameter, the processor 302 may execute the three-stage verification process described herein. At block 705, the processor 302 assigns the first NAND block to a temporary bad block (TBB) list based on the failure verification parameter (e.g., when the failure verification parameter satisfies a temporary failure condition) and a number of a set of the plurality of NAND blocks assigned to the TBB list.

As an example implementation of blocks 701, 703, 705, the processor 302 may determine whether the junction temperature is outside of a threshold junction temperature range upon detecting that the failure occurred more than the threshold failure number, such as three times. If the junction temperature is outside of the threshold junction temperature range, then the processor 302 may assign the NAND block to the TBB upon determining that the TBB is not full (e.g., a number of a set of the plurality of NAND blocks assigned to the TBB list is less than the threshold number of NAND blocks) and perform the erase operation on NAND blocks listed in the TBB list during standard operating conditions, as described below in further detail. However, if the failure has not occurred three times, then the processor 302 may perform read/write operations, as the temperature is within the threshold junction temperature range. As the junction temperature is within the operating temperature range, the processor 302 may check for the voltage levels and assign the NAND block to the TBB list based on whether the TBB list is full and the voltage values. When both the junction temperature and the voltage levels are within the respective threshold ranges, the processor 302 may compare the ON/OFF cell count to a threshold count value and assign the NAND block to the TBB list based on the ON/OFF cell count and a determination of whether the TBB list is full.

At block 707, the method 700 may include determining that the NAND flash memory device has failed when the number of the set of NAND blocks assigned to the TBB list is greater than or equal to a threshold NAND block number. As an example implementation of block 707, the processor 302 may set an exception bit such that a host device having the NAND flash memory is reset when the TBB list is full.

In some embodiments, the processor 302 may perform the erase operation on the NAND blocks listed in the TBB list during the standard operating conditions and when the number of the set of NAND blocks assigned to the TBB list is less than the threshold NAND block number. As an example, the erase operation may be initiated on the NAND blocks listed in the TBB list after an idle time and at the threshold junction temperature range and the threshold operating voltage range. Further, the NAND blocks may be transferred from the TBB list to a Free Block (FB) list upon successful erase operations. However, when there is an unsuccessful erase operation, then the processor 302 may transfer the NAND blocks from the TBB list to a Run time Bad Block (RTBB) list.

The present disclosure may be used for enhancing the lifespan of a NAND flash memory having a plurality of NAND blocks performing read/write operations. The present disclosure initially detects the temporary EF, PF and UECC errors, which may avoid unnecessary RB remapping. The use case scenario of the present disclosure may be in Automotive UFS or SSDs but is not limited thereto. In the above-mentioned case scenario when the NAND flash memory device that may be used in various geographical scenarios and may be operated at different high or low temperatures due to which there may be a temporary failure. During such scenarios, the present disclosure helps reset the device when the device (NAND flash memory) is operating in an abnormal host environment.

Computing System

Figure 8:
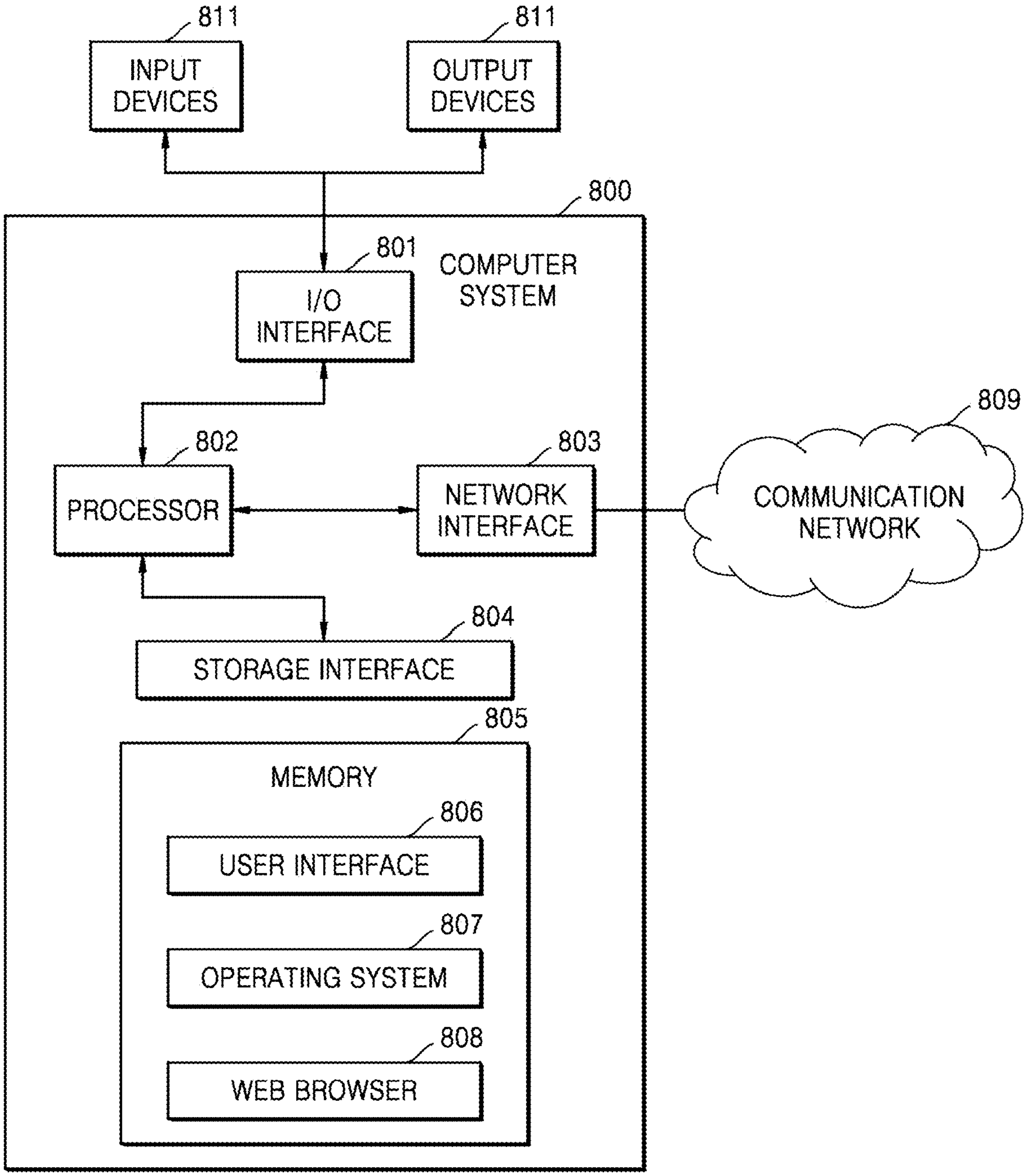
FIG. 8 illustrates a block diagram of an exemplary computer system in accordance with some embodiments of the present disclosure.

In some embodiments, FIG. 8 illustrates a block diagram of an exemplary computing system 800 for implementing embodiments of the present disclosure. In some embodiments, the computing system 800 for enhancing a lifespan of a NAND flash memory having a plurality of NAND blocks performing read/write operations. The computer system 800 may include a central processing unit ("CPU" or "processor") 802. The processor 802 may include at least one data processor 802 for executing program components for executing user or system-generated business processes. The processor 802 may include specialized processing units such as integrated system (bus) controllers, memory management control units, floating point units, graphics processing units, digital signal processing units, etc. The processor 302 may be implemented by the processor 802 in some embodiments.

The processor 802 may be disposed in communication with input devices 811 and output devices 812 via I/O interface 801. The I/O interface 801 may employ communication protocols/methods such as, without limitation, audio, analog, digital, stereo, IEEE-1394, serial bus, Universal Serial Bus (USB), infrared, PS/2, BNC, coaxial, component, composite, digital visual interface (DVI), high-definition multimedia interface (HDMI), Radio Frequency (RF) antennas, s-video, video graphics array (VGA), IEEE 802.n/b/g/n/x, Bluetooth, cellular (e.g., code-division multiple access (CDMA), high-speed packet access (HSPA+), global system for mobile communications (GSM), long-term evolution (LTE), WiMax, or the like), etc. Using the I/O interface 801, computer system 800 may communicate with input devices 811 and output devices 812.

In some embodiments, the processor 802 may be disposed in communication with a communication network 809 via a network interface 803. The network interface 803 may communicate with the communication network 809. The network interface 803 may employ connection protocols including, without limitation, direct connect, Ethernet (e.g., twisted pair 10/100/1000 Base T), transmission control protocol/internet protocol (TCP/IP), token ring, IEEE 802.11a/b/g/n/x, etc. The communication network 809 can be implemented as one of the different types of networks, such as intranet or Local Area Network (LAN), controller area network (CAN) and such within the vehicle. The communication network 809 may either be a dedicated network or a shared network, which represents an association of the different types of networks that use a variety of protocols, for example, Hypertext Transfer Protocol (HTTP), CAN Protocol, Transmission Control Protocol/Internet Protocol (TCP/IP), Wireless Application Protocol (WAP), etc., to communicate with each other. Further, the communication network 809 may include a variety of network devices, including routers, bridges, servers, computing devices, storage devices, etc. The one or more computing devices may include, but not limited to, a mobile phone, a tablet phone, a laptop and the like. In some embodiments, the processor 802 may be disposed in communication with a memory 805 (e.g., RAM, ROM, etc. not shown in FIG. 8) via a storage interface 804. The storage interface 804 may connect to memory 805 including, without limitation, memory drives, removable disc drives, etc., employing connection protocols such as Serial Advanced Technology Attachment (SATA), integrated drive electronics (IDE), IEEE-1394, universal serial bus (USB), fiber channel, small computer systems interface (SCSI), etc. The memory drives may further include a drum, magnetic disc drive, magneto-optical drive, optical drive, redundant array of independent discs (RAID), solid-state memory devices, solid-state drives, etc. The memory 805 may store a collection of program or database components, including, without limitation, a user interface 806, an operating system 807, a web browser 808 etc. In some embodiments, the computer system 800 may store user/application data, such as the data, variables, records, etc. as described in this disclosure. Such databases may be implemented as fault-tolerant, relational, scalable, secure databases such as Oracle or Sybase.

The operating system 807 may facilitate resource management and operation of the computer system 800. Examples of operating systems include, without limitation, APPLE® MACINTOSH® OS X®, UNIX®, UNIX-like system distributions (E.G., BERKELEY SOFTWARE DISTRIBUTION® (BSD), FREEBSD®, NETBSD®, OPENBSD, etc.), LINUX® DISTRIBUTIONS (E.G., RED HAT®, UBUNTU®, KUBUNTU®, etc.), IBM® OS/2®, MICROSOFT® WINDOWS® (XP®, VISTA®/7/8, 10 etc.), APPLE® IOS®, GOOGLE™ ANDROID™, BLACKBERRY® OS, or the like. The User interface 806 may facilitate display, execution, interaction, manipulation, or operation of program components through textual or graphical facilities. For example, user interfaces may provide computer interaction interface elements on a display system operatively connected to the computer system 800, such as cursors, icons, check boxes, menus, scrollers, windows, widgets, etc. Graphical User Interfaces (GUIs) may be employed, including, without limitation, Apple® Macintosh® operating systems' Aqua®, IBM® OS/2®, Microsoft® Windows® (e.g., Acro, Metro, etc.), web interface libraries (e.g., ActiveX®, Java®, Javascript®, AJAX, HTML, Adobe® Flash®, etc.), or the like.

In some embodiments, the computer system 800 may implement the web browser 808 stored program components. The web browser 808 may be a hypertext viewing application, such as MICROSOFT® INTERNET EXPLORER®, GOOGLE™ CHROME™, MOZILLA®) FIREFOX®, APPLE® SAFARI®, etc. Secure web browsing may be provided using Secure Hypertext Transport Protocol (HTTPS), Secure Sockets Layer (SSL), Transport Layer Security (TLS), etc. Web browsers 808 may utilize facilities such as AJAX, DHTML, ADOBE® FLASH®, JAVASCRIPT®, JAVA®, Application Programming Interfaces (APIs), etc. In some embodiments, the computer system 800 may implement a mail server stored program component. The mail server may be an Internet mail server such as Microsoft Exchange, or the like. The mail server may utilize facilities such as Active Server Pages (ASP), ACTIVEX®, ANSI® C++/C#, MICROSOFT®, .NET, CGI SCRIPTS, JAVA®, JAVASCRIPT®, PERL®, PHP, PYTHON®, WEBOBJECTS®, etc. The mail server may utilize communication protocols such as Internet Message Access Protocol (IMAP), Messaging Application Programming Interface (MAPI), MICROSOFT® exchange, Post Office Protocol (POP), Simple Mail Transfer Protocol (SMTP), or the like. In some embodiments, the computer system 800 may implement a mail client stored program component. The mail client may be a mail viewing application, such as APPLE® MAIL, MICROSOFT® ENTOURAGE®, MICROSOFT® OUTLOOK®, MOZILLA® THUNDERBIRD®, etc.

Furthermore, one or more computer-readable storage media may be utilized in implementing embodiments of the present disclosure. A computer-readable storage medium refers to any type of physical memory on which information or data readable by a processor 802 may be stored. Thus, a computer-readable storage medium may store instructions for execution by one or more processor 802, including instructions for causing the processor 802 to perform steps or stages of the embodiments described herein. The term "computer-readable medium" should be understood to include tangible items and exclude carrier waves and transient signals, i.e., non-transitory. Examples include Random Access Memory (RAM), Read-Only Memory (ROM), volatile memory, non-volatile memory, hard drives, Compact Disc (CD) ROMs, Digital Video Disc (DVDs), flash drives, disks, and any other known physical storage media.

The terms "an embodiment", "embodiment", "embodiments", "the embodiment", "the embodiments", "one or more embodiments", "some embodiments", and "one embodiment" mean "one or more (but not all) embodiments of the disclosure(s)" unless expressly specified otherwise.

The terms "including", "comprising", "having" and variations thereof mean "including but not limited to", unless expressly specified otherwise. The enumerated listing of items does not imply that any or all the items are mutually exclusive, unless expressly specified otherwise.

The terms "a", "an" and "the" mean "one or more", unless expressly specified otherwise. A description of an embodiment with several components in communication with each other does not imply that all such components are required. On the contrary, a variety of optional components are described to illustrate the wide variety of possible embodiments of the disclosure.

When a single device or article is described herein, it will be clear that more than one device/article (whether they cooperate) may be used in place of a single device/article. Similarly, where more than one device or article is described herein (whether they cooperate), it will be clear that a single device/article may be used in place of the more than one device or article or a different number of devices/articles may be used instead of the shown number of devices or programs. The functionality and/or the features of a device may be alternatively embodied by one or more other devices which are not explicitly described as having such functionality/features. Thus, other embodiments of the disclosure need not include the device itself.

Finally, the language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based here on. Accordingly, the embodiments of the present disclosure are intended to be illustrative, but not limiting, of the scope of the disclosure, which is set forth in the following claims.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

We claim:

1. A method of operating a NAND flash memory of a host device, the NAND flash memory having a plurality of NAND blocks configured to perform a read/write operation, the method comprising:

detecting a failure of a first NAND block among the plurality of NAND blocks;

in response to detecting the failure of the first NAND block, determining a failure verification parameter of the first NAND block, wherein the failure verification parameter comprises at least one of a junction temperature of the first NAND block, one or more voltage levels of the first NAND block, or an ON/OFF cell count of the first NAND block;

assigning the first NAND block to a temporary bad block (TBB) list based on the failure verification parameter and a number of a set of the plurality of NAND blocks assigned to the TBB list; and determining that the NAND flash memory has failed in response to the number of the set of NAND blocks assigned to the TBB list being greater than or equal to a threshold NAND block number.

2. The method of claim 1, wherein the failure is one of a program failure, an erase failure, or an uncorrectable error correction code.

3. The method of claim 1, comprising:

receiving a read/write request from the host device;

initiating a read/write operation of the first NAND block in response to receiving the read/write request; and determining whether a number of read/write operation failures is greater than a threshold failure number, wherein the detecting of the failure of the first NAND block comprises:

detecting the failure of the first NAND block in response to the number of read/write operation failures being greater than the threshold failure number.

4. The method of claim 3, comprising:

determining the junction temperature of the first NAND block in response to detecting the failure of the first NAND block; and determining whether or not the junction temperature of the first NAND block is within a threshold junction temperature range.

5. The method of claim 4, wherein the assigning the first NAND block to the TBB list comprises:

assigning the first NAND block to the TBB list in response to a determination that the junction temperature of the first NAND block is not within the threshold junction temperature range.

6. The method of claim 4, wherein the determining of the one or more voltage levels of the first NAND block comprises:

determining the one or more voltage levels of the first NAND block in response to a determination that the junction temperature of the first NAND block is within the threshold junction temperature range; and determining whether the one or more voltage levels are within a threshold voltage range.

7. The method of claim 6, comprising assigning the first NAND block to the TBB list in response to a determination that at least one of the one or more voltage levels is not within the threshold voltage range.

8. The method of claim 6, wherein the assigning of the first NAND block to the TBB list comprises:

determining the ON/OFF cell count of the first NAND block in response to a determination that the one or more voltage levels are within the threshold voltage range;

determining whether the ON/OFF cell count is greater than a threshold ON/OFF cell count value; and assigning the first NAND block to the TBB list in response to a determination that the ON/OFF cell count is greater than the threshold ON/OFF cell count value.

9. The method of claim 1, comprising transferring the first NAND block from the TBB list to a free block list in response to performing an erase operation on the first NAND block.

10. An apparatus for operating a NAND flash memory of a host device, the NAND flash memory having a plurality of NAND blocks configured to perform a read/write operation, the apparatus comprising:

a processing unit configured to:

detect a failure of a first NAND block among the plurality of NAND blocks;

in response to detecting the failure of the first NAND block, determine a failure verification parameter of the first NAND block, wherein the failure verification parameter comprises at least one of a junction temperature of the first NAND block, one or more voltage levels of the first NAND block, and an ON/OFF cell count of the first NAND block;

assign the first NAND block to a temporary bad block (TBB) list based on the failure verification parameter and a number of a set of the plurality of NAND blocks assigned to the TBB list;

determine that the NAND flash memory has failed in response to the number of the set of NAND blocks assigned to the TBB list being greater than or equal to a threshold NAND block number.

11. The apparatus of claim 10, wherein the failure is one of a program failure, an erase failure, or an uncorrectable error correction code.

12. The apparatus of claim 10, wherein the processing unit is configured to:

receive a read/write request from the host device;

initiate a read/write operation of the first NAND block in response to receiving the read/write request;

determine whether a number of read/write operation failures is greater than a threshold failure number; and detect the failure of the first NAND block in response to the number of read/write operation failures being greater than the threshold failure number.

13. The apparatus of claim 12, wherein the processing unit is configured to:

determine the junction temperature of the first NAND block in response to detecting the failure of the first NAND block; and determine whether or not the junction temperature of the first NAND block is within a threshold junction temperature range.

14. The apparatus of claim 13, wherein the processing unit is configured to assign the first NAND block to the TBB list in response to a determination that the junction temperature of the first NAND block is not within the threshold junction temperature range.

15. The apparatus of claim 14, wherein the processing unit is configured to:

determine the one or more voltage levels of the first NAND block in response to a determination that the junction temperature of the first NAND block is within the threshold junction temperature range; and determine whether the one or more voltage levels are within a threshold voltage range.

16. The apparatus of claim 15, wherein the processing unit is configured to assign the first NAND block to the TBB list in response to a determination that at least one of the one or more voltage levels is not within the threshold voltage range.

17. The apparatus of claim 15, wherein the processing unit is configured to:

determine the ON/OFF cell count of the first NAND block in response to a determination that the one or more voltage levels are within the threshold voltage range;

determine whether the ON/OFF cell count is greater than a threshold value ON/OFF cell count value; and assign the first NAND block to the TBB list in response to a determination that the ON/OFF cell count is greater than the threshold ON/OFF cell count value.

18. The apparatus of claim 10, wherein the processing unit is configured to transfer the first NAND block from the TBB list to a free block list in response to performing an erase operation on the first NAND block.

19. A method of operating a NAND flash memory of a host device, the NAND flash memory having a plurality of NAND blocks configured to perform a read/write operation, the method comprising:

determining whether a number of read/write operation failures is greater than a threshold failure number;

detecting a failure of a first NAND block among the plurality of NAND blocks in response to a determination that the number of read/write operation failures is greater than the threshold failure number, wherein the failure is one of a program failure, an erase failure, or an uncorrectable error correction code;

in response to detecting the failure of the first NAND block, determining a failure verification parameter of the first NAND block, wherein the failure verification parameter comprises at least one of a junction temperature of the first NAND block, one or more voltage levels of the first NAND block, or an ON/OFF cell count of the first NAND block;

determining whether the failure verification parameter corresponds to a temporary failure condition;

determining whether a number of a set of the plurality of NAND blocks assigned to a temporary bad block (TBB) list is less than a threshold NAND block number; and assigning the first NAND block to the TBB list in response to a determination that the failure verification parameter corresponds to the temporary failure condition and in response to a determination that the number of the set of the plurality of NAND blocks assigned to the TBB list is less than the threshold NAND block number.

20. The method of claim 19, wherein the failure verification parameter corresponds to the temporary failure condition in response to one of the junction temperature of the first NAND block being within a threshold junction temperature range, the one or more voltage levels being within a threshold voltage range, or the ON/OFF cell count being greater than a threshold ON/OFF cell count value.

* * * * *